United States Patent
Ueno et al.

(10) Patent No.: US 9,356,140 B2
(45) Date of Patent: May 31, 2016

(54) SEMICONDUCTOR DEVICE

(71) Applicant: TOYODA GOSEI CO., LTD., Kiyosu (JP)

(72) Inventors: Yukihisa Ueno, Kiyosu (JP); Toru Oka, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 13/913,011

(22) Filed: Jun. 7, 2013

(65) Prior Publication Data

US 2013/0328120 A1 Dec. 12, 2013

(30) Foreign Application Priority Data

Jun. 8, 2012 (JP) ................. 2012-131342

(51) Int. Cl.
| | | |
|---|---|---|
| *H01L 29/02* | (2006.01) | |
| *H01L 29/78* | (2006.01) | |
| *H01L 29/861* | (2006.01) | |
| *H01L 29/40* | (2006.01) | |
| *H01L 29/417* | (2006.01) | |
| *H01L 29/06* | (2006.01) | |
| *H01L 29/20* | (2006.01) | |
| *H01L 29/51* | (2006.01) | |

(52) U.S. Cl.
CPC ........ *H01L 29/7827* (2013.01); *H01L 29/0661* (2013.01); *H01L 29/407* (2013.01); *H01L 29/41741* (2013.01); *H01L 29/7811* (2013.01); *H01L 29/7813* (2013.01); *H01L 29/861* (2013.01); *H01L 29/8613* (2013.01); *H01L 29/2003* (2013.01); *H01L 29/41766* (2013.01); *H01L 29/517* (2013.01); *H01L 29/518* (2013.01)

(58) Field of Classification Search
CPC ............ H01L 29/7827; H01L 29/8613; H01L 29/41741; H01L 29/7811; H01L 29/06; H01L 29/0603; H01L 29/0607; H01L 29/861; H01L 29/0611; H01L 29/0661; H01L 29/402; H01L 29/408
See application file for complete search history.

(56) References Cited

U.S. PATENT DOCUMENTS 4,047,196 A * 9/1977 White et al. ................... 257/496
5,166,769 A * 11/1992 Einthoven et al. ............ 257/496

(Continued)

FOREIGN PATENT DOCUMENTS

JP 2012-019188 1/2012

OTHER PUBLICATIONS

"Over 1.0k V GaN p-n junction diodes on free-standing GaN substrates" Kazuki Nomoto, et al., Phys. Status Solidi A 208, No. 7, 1535-1537.
Chinese Office Action dated Jul. 27, 2015 with English Translation.

*Primary Examiner* — Fei Fei Yeung Lopez
(74) *Attorney, Agent, or Firm* — McGinn IP Law Group, PLLC.

(57) ABSTRACT

A device comprises a substrate, an n-layer and a p-layer, an n-electrode, and a p-electrode. A step is formed at an outer circumference of the device. A protective film is formed so as to continuously cover a side surface and a bottom surface of the step. A field plate electrode connected with the p-electrode is formed on the protective film. When a distance from the pn junction interface to the surface of the protective film on the bottom surface of the step is defined as h (μm), a dielectric constant of the protective film is defined as $\epsilon_s$, and a thickness of the protective film at the pn junction interface on the side surface of the step is defined as d (μm), $(\epsilon_s \cdot h)/d$ is 4 or more, and $\epsilon_s/d$ is 3 (1/μm) or more.

7 Claims, 5 Drawing Sheets

(56) References Cited

U.S. PATENT DOCUMENTS

| | | | |
|---|---|---|---|
| 5,914,499 A * | 6/1999 | Hermansson et al. | 257/77 |
| 6,054,752 A * | 4/2000 | Hara et al. | 257/629 |
| 6,555,873 B2 * | 4/2003 | Disney et al. | 257/342 |
| 2001/0005627 A1 * | 6/2001 | Matsubara | 438/637 |
| 2001/0023955 A1 * | 9/2001 | Matsui et al. | 257/300 |
| 2003/0006453 A1 * | 1/2003 | Liang et al. | 257/328 |
| 2005/0045982 A1 * | 3/2005 | Shenai | 257/481 |

* cited by examiner

SEMICONDUCTOR DEVICE

BACKGROUND OF THE INVENTION

1. Field of the Invention

The present invention relates to a vertical semiconductor device having a field plate structure, particularly characterized by the thickness of the protective film in the field plate structure and the depth of the step.

2. Background Art

Semiconductor devices such as diode or FET can be classified into two types by its structure: a vertical type which establishes electrical continuity in a direction perpendicular to the main surface and a horizontal type which establishes electrical continuity in a direction parallel to the main surface. The vertical type has more advantages such as high breakdown voltage or improved area efficiency than the horizontal type. In the vertical semiconductor device having a pn junction structure, a pn junction interface is exposed on the side surface of the step. When a reverse voltage is applied, a large electric field is concentrated at the end of this pn junction interface, causing a problem that the breakdown voltage of the semiconductor device does not reach the design value. Therefore, the concentration of the electric field at the end of the pn junction interface is decreased by employing a field plate structure. In this case, the field plate structure comprises a protective film which covers the side surface and the bottom surface of the step and a field plate electrode which covers the side surface and the bottom surface of the step via the protective film.

Non-patent Document 1 discloses a vertical pn diode formed of Group III nitride semiconductor having a field plate structure.

Patent Document 1 discloses a vertical MOSFET formed of SiC having a field plate structure. In this patent application, the depth and the breakdown voltage of the step are not particularly considered.

Patent Document 1: Japanese Patent Application Laid-Open (kokai) No. 2012-19188

Non-patent Document 1: Kazuki Nomoto et al., Phys. Status Solidi A 208, No. 7, 1535-1537 (2011)

However, the field plate structure suitable for high breakdown voltage, e.g. the thickness of the protective film or the depth of the step is not deeply considered in Non-patent Document 1 and Patent Document 1. Just employing the field plate structure is not enough to achieve a high breakdown voltage performance as designed.

SUMMARY OF THE INVENTION

In view of the foregoing, an object of the present invention is to improve breakdown voltage performance of a vertical semiconductor device having a field plate structure.

In a first aspect of the present invention, there is provided a vertical semiconductor device having a pn junction structure, a step (formed by a mesa and a step) disposed at an outer circumference of the device, and a pn junction interface exposed on a side surface of the step, wherein a dielectric protective film is formed so as to continuously cover a side surface and a bottom surface of the step, a field plate electrode is formed so as to continuously cover the side surface and the bottom surface of the step via the protective film, and when a distance from the pn junction interface to the surface of the protective film at the bottom of the step is defined as h (μm), and the dielectric constant of the protective film is defined as $\in_s$, the thickness of the protective film at the pn junction interface on the side surface of the step is as d (μm), $(\in_s \cdot h)/d$ is 4 or more, and $\in_s/d$ is 3 (1/μm) or more.

$(\in_s \cdot h)/d$ and $\in_s/d$ are the indices introduced by the inventors to evaluate the breakdown voltage of the device. This allows accurate evaluation of the device breakdown voltage. When $(\in_s \cdot h)/d$ is 4 or more, and $\in_s/d$ is 3 (1 μm) or more, a high breakdown voltage performance as designed can be achieved. More preferably, $(\in_s \cdot h)/d$ is 4 or more, and $\in_s/d$ is 4 (1/μm) or more. Further preferably, $(\in_s \cdot h)/d$ is 5 or more, and $\in_s/d$ is 10 (1/μm) or more. The upper limits of $(\in_s \cdot h)/d$ and $\in_s/d$ may be within a range that the semiconductor device can perform its function. Also desirable range of the distance h is larger than 0 μm and not less than 1 mm. And desirable range of the thickness d is 0.005 μm to 1 mm. More preferably h is from 0.0025 μm to 100 μm. And the thickness d is 0.01 μm to 100 μm.

The protective film may comprise a single layer or a plurality of layers. In case of a single layer, $SiN_x$, $Al_2O_3$, $HfO_2$, $ZrO_2$, AlN, HfON, ZrON, and others may be used. In case of a plurality of layers, $Al_2O_3/SiO_2$, $SiO_2/ZrO_2$, $SiO_2/Al_2O_3$, $SiO_2/HfO_2$, $SiO_2/ZrON$, $SiN/SiO_2$, $Al_2O_3/ZrO_2$, $SiN/SiO_2/ZrO_2$, $SiO_2/Al_2O_3/HfO_2$, and others may be used. When a high dielectric constant material such as $HfO_2$ is used as the protective film, the thickness of the protective film can be reduced. As a result, the depth of the step can be reduced, and the time taken to form the step can be shortened. When the protective film comprises a plurality of layers, the thickness d is the total thickness of those layers, and ∈s is an effective dielectric constant.

The protective film preferably has a smaller thickness at the pn junction interface on the side surface of the step than at the bottom of the step. The smaller the thickness of the protective film at the pn junction interface on the side surface of the step, the higher the effect of reducing the concentration of the electric field at the pn junction interface on the side surface of the step.

The bottom edge of the step is preferably rounded. When the edge is rounded, the concentration of the electric field at the edge is reduced, thereby improving the breakdown voltage. Similarly, the top edge of the step is preferably rounded. The termination structure (step) is a structure in which a side surface and a bottom surface of the semiconductor layer are exposed by a trench or a mesa at the device end, e.g. a step or a device isolation trench. Accordingly, the step includes a trench which has two steps on the both side and a bottom surface. The trench may include a plurality of trench.

Al, Ni, Au, TiN, or polysilicon may be used as the field plate electrode. Particularly, a material superior in adhesion with the protective film is preferably used. For example, Al is used for $SiO_2$.

In the present invention, the pn junction includes a structure having other layer structure between the p-layer and the n-layer as well as a structure in which the p-type conductive p-layer is in direct contact with the n-type conductive n-layer. For example, a structure having an i-layer formed of intrinsic semiconductor between the p-layer and the n-layer is also referred to as the pn junction in the present invention. Also a slightly doped n-layer or p-layer may be existed between the p-layer and the n-layer. In those cases, distance h is defined with an interface between the p-layer and other layer as a pn junction interface. When a plurality of pn junction interfaces are exposed on the side surface of the step, the interface from which a depletion layer most expands from the p-layer to the n-layer is defined as a datum.

The semiconductor device of the present invention may be formed of any semiconductor material, e.g. Group III nitride semiconductor such as GaN, AlGaN, and InGaN, Group III-V semiconductor such as GaAs or GaP, Group IV semiconductor such as Si and SiC, Group II-VI semiconductor such as ZnO, and organic semiconductor.

The present invention can be applied to a semiconductor device having a pn junction and any structure in which the pn junction interface is exposed on the side surface of the mesa, e.g. pn diode, PIN diode, FET, bipolar transistor, and others.

A second aspect of the present invention is drawn to a specific embodiment of the vertical semiconductor device according to the first aspect of the invention, wherein h/d is 0.5 or more.

h/d is the index introduced by the inventors to evaluate the breakdown voltage of the device, thereby evaluating the distance h and the thickness d of the protective film required to improve the breakdown voltage. When this index h/d is 0.5 or more, a high breakdown voltage performance as designed can be achieved. More preferably, $0.5 \leq h/d \leq 3$, and further preferably, $1 \leq h/d \leq 2$.

A third aspect of the present invention is drawn to a specific embodiment of the vertical semiconductor device according to the first or second aspect of the invention, wherein an angle between the bottom surface of the step and the side surface of the step is 70° to 90°.

A fourth aspect of the present invention is drawn to a specific embodiment of the vertical semiconductor device according to the first to third aspects of the invention, wherein the bottom edge of the step is rounded.

A fifth aspect of the present invention is drawn to a specific embodiment of the vertical semiconductor device according to the first to fourth aspects of the invention, wherein the thickness of the protective film at the pn junction interface on the side surface of the step is smaller than that at the bottom surface of the step.

A sixth aspect of the present invention is drawn to a specific embodiment of the vertical semiconductor device according to the first to fifth aspects of the invention, wherein the semiconductor device is formed of Group III nitride semiconductor.

A seventh aspect of the present invention is drawn to a specific embodiment of the vertical semiconductor device according to the first to sixth aspects of the invention, wherein the semiconductor device is a pn diode.

An eighth aspect of the present invention is drawn to a specific embodiment of the vertical semiconductor device according to the first to sixth aspects of the invention, wherein the semiconductor device is a vertical transistor.

According to the present invention, in the vicinity of the pn junction interface exposed on the side surface of the step, a sufficiently large electric field relaxing region cannot be formed, and the concentration of the electric field is reduced, thereby further improving the breakdown voltage.

According to the second aspect of the present invention, the depth of the step and the thickness of the protective film can be appropriately set, thereby achieving a high breakdown voltage performance.

According to the third aspect of the present invention, the breakdown voltage can be further improved.

According to the fourth aspect of the present invention, the concentration of the electric field at the bottom edge of the step can be reduced, thereby further improving the breakdown voltage.

As in the fifth aspect of the present invention, the breakdown voltage of the device can be further improved by changing the thickness of the protective film at forming locations.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

Specific embodiments of the present invention will next be described with reference to the drawings. However, the present invention is not limited to the embodiments.

Embodiment 1

Figure 1:
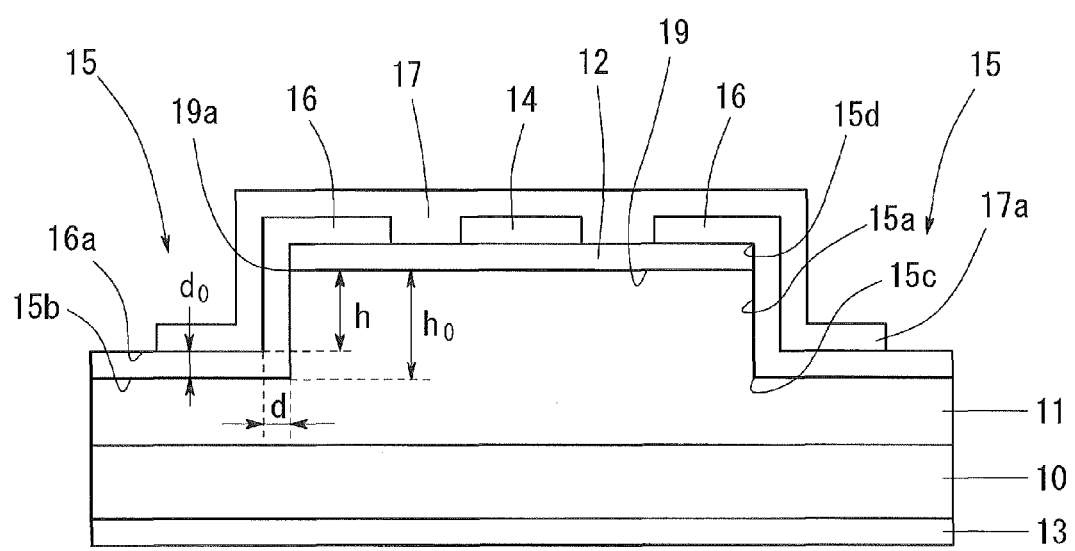
FIG. 1 shows the configuration of a vertical semiconductor device according to Embodiment 1.

FIG. 1 shows the configuration of a vertical diode according to Embodiment 1. The vertical diode according to Embodiment 1 comprises a substrate 10, an n-layer 11 disposed on the substrate 10, and a p-layer 12 disposed on the n-layer 11 as shown in FIG. 1. An n-electrode 13 is formed in contact with the substrate 10 on the surface opposite the surface of the substrate 10 on which the p-layer 11 is formed, and a p-electrode 14 is formed on a portion of the p-layer 12. The vertical diode according to Embodiment 1 has a field plate structure comprising a protective film 16 and a field plate electrode 17. The vertical diode according to Embodiment 1 is a circle in plan view, whose diameter is 200 μm. The shape in plan view is not limited to a circle, and may be a rectangle. In case of a rectangle, the corners are preferably rounded, thereby improving the breakdown voltage performance.

The substrate 10 comprises n-GaN. A substrate of any material other than n-GaN may be used, which has conductivity and is used as a Group III nitride semiconductor growth substrate. For example, ZnO or Si may be used. However, preferably a GaN substrate is used as in the present Embodiment in terms of lattice matching.

The n-layer 11 comprises n$^-$-GaN, and the p-layer 12 comprises p$^+$-GaN. The n-layer 11 and the p-layer 12 may comprise a plurality of layers having different impurity concentrations. The n-layer 11 and the p-layer 12 may comprise a plurality of Group III nitride semiconductor layers having different compositional ratios. Other layer may be formed between the n-layer 11 and the p-layer 12, e.g. an i-layer having an intrinsic conductivity.

The n-type impurity concentration of the n-layer 11 is preferably 1/1000 or less than the p-type impurity concentration of the p-layer 12. A depletion layer extends from a pn junction interface 19 between the n-layer 11 and the p-layer 12, thereby reducing the influence of the structure of the n-layer 11 and the p-layer 12 on the breakdown voltage performance. This facilitates high breakdown voltage design of the vertical diode according to Embodiment 1.

The n-electrode 13 comprises Ti/Al, and the p-electrode 14 comprises Ni/Au. Here, "/" means that layers are deposited. A/B means that layer B is formed after layer A was formed. Hereinafter, the same is applied in the description of material. The n-electrode 13 is preferably formed of a material that makes an ohmic contact with an n-type Group III nitride semiconductor. For example, Ti/Al/Ni/Au, TiN/Al, and Pd/Ti/Al may be used. The p-electrode 14 is preferably formed of a material that makes an ohmic contact with a p-type Group III nitride semiconductor. A material such as Pd/Au and Co/Au may be used.

A step 15, i.e., deep trench isolation, is formed along the periphery of the device which is formed mesa. The step 15 is formed so as to have a depth extending from the surface of the p-layer 12 (the surface on which the p-electrode 14 is formed) to the n-layer 11. Therefore, an end portion 19a of the pn junction interface 19 between the p-layer 12 and the n-layer 11 is exposed on the side surface 15a of the step 15. The side surface 15a of the step 15 may be perpendicular to or at an angle to the bottom surface 15b of the step 15. When it is angled, i.e., the side surface 15a is inclined, the electric field strength of the side surface 15a is reduced, thereby improving the breakdown voltage. The side surface 15a of the step 15 is preferably inclined by 70° to 90° with respect to the bottom surface 15b of the step 15.

Figure 4:
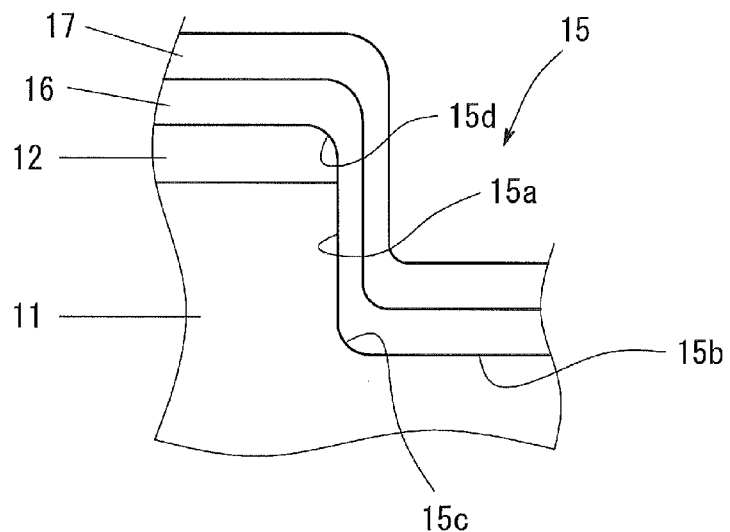
FIG. 4 is an enlarged view of step 15.

The bottom edge 15c of the step 15 (a boundary between the side surface 15a and the bottom surface 15b of the step 15) is preferably rounded as shown FIG. 4. Such rounding of the edge 15c can reduce the concentration of the electric field at the edge, thereby improving the breakdown voltage. The bottom edge 15c of the step 15 can be rounded by controlling the dry etching conditions when forming the step 15. When rounding the edge 15c, the radius of curvature is preferably 0.01 μm or more. Similarly, the top edge 15d of the step 15 (a boundary between the side surface 15a of the step 15 and the p-layer 12) is preferably rounded.

The protective film 16 constituting a field plate structure is formed so as to continuously cover the bottom surface 15b and the side surface 15a of the step 15. Moreover, the protective film 16 is also formed at a portion in the vicinity of the side surface 15a of the step 15 on the surface of the p-layer 12 (the surface in contact with the p-electrode 14). The protective film 16 is not necessarily formed on the surface of the p-layer 12 as long as it is formed so as to continuously cover the bottom surface 15b and the side surface 15a of the step 15.

The protective film 16 may comprise a plurality of layers or a single layer. In case of a single layer, for example, $SiN_x$, $Al_2O_3$, $HfO_2$, $ZrO_2$, AlN, HfON, ZrON may be used. In case of a plurality of layers, for example, $Al_2O_3/SiO_2$, $SiO_2/ZrO_2$, $SiO_2/ZrON$, $SiO_2/Al_2O_3$, $SiO_2/HfO_2$, $SiN/SiO_2$, $Al_2O_3/ZrO_2$, $SiN/SiO_2/ZrO_2$, and $SiO_2/Al_2O_3/HfO_2$ may be used. When a high dielectric constant material such as $HfO_2$ is used as the protective film 16, the thickness of the protective film 16 can be reduced, resulting in reducing the depth of the step 15 can be reduced. This can shorten the time taken to form the step 15, and reduce the difficulty of forming the step 15.

The protective film 16 may have different thickness at the side surface 15a (thickness in a direction perpendicular to the side surface 15a at the side surface 15a) and the bottom surface 15b (thickness in a direction perpendicular to the bottom surface 15b at the bottom surface 15b). Particularly preferably, as shown in FIG. 4, the thickness of the protective film 16 is smaller at the side surface 15a and larger at the bottom surface 15b. The smaller the thickness of the protective film 16 at the side surface 15a is, the higher the breakdown voltage. The thickness of the protective film 16 at the bottom surface 15b is preferably larger to reduce the concentration of the electric field at an end portion 17a of the field plate electrode 17 formed via the protective film 16 on the bottom surface 15b. Therefore, the protective film 16 is preferably formed so as to have a smaller thickness at the side surface 15a than that at the bottom surface 15b. The dielectric constant of the whole protective film 16 can be adjusted by forming the protective film comprising a plurality of layers, thereby facilitating the design to achieve a desired breakdown voltage.

The field plate electrode 17 constituting the field plate structure is formed via the protective film 16 so as to continuously cover the bottom surface 15b and the side surface 15a of the step 15, and the surface of the p-layer 12. Moreover, the field plate electrode 17 is also formed so as to continuously cover the surface of the p-layer 12 where the protective film 16 is not formed, and the surface of the p-electrode 14, thus the field plate electrode 17 and the p-electrode 14 are connected. The end portion 17a of the field plate electrode 17 is disposed via the protective film 16 on the bottom surface 15b of the step 15.

Since the field plate structure comprises the protective film 16 and the field plate electrode 17, a reverse voltage is also applied to the field plate electrode 17 connected to the p-electrode 15 when a reverse voltage is applied to the n-electrode 14 and the p-electrode 15, thereby a depletion layer is formed in the n-layer 11 in the vicinity of the side surface 15a and the bottom surface 15b of the step 15. Such field plate structure can improve the breakdown voltage.

The field plate electrode 17 comprises Al and has a thickness of 700 nm. The field plate electrode 17 may be formed of any material having a conductivity and a good adhesion with the protective film 16. Ni, Au, TiN, or polysilicon may be used other than Al. The field plate electrode 17 is disposed in contact with the surface of the p-layer 12 on a portion of the exposed p-layer 12 where the protective film 16 and the p-electrode 14 are not formed. However, a portion of the p-layer 12 may not be exposed by covering the surface of the p-layer 12 with the protective film 16 or the p-electrode 14 so that the field plate electrode 17 is not directly contact with the surface of the p-layer 12. The field plate electrode 17 may have different thickness at forming locations. For example, the thickness of the field plate electrode 17 may be different at the side surface 15a and the bottom surface 15b.

In the vertical diode according to Embodiment 1, when the relative permittivity (hereinafter "dielectric constant") of the protective film 16 is defined as $\in_s$, the thickness at the pn junction interface 19a on the side surface 15a of the step 15 (the shortest distance from the pn junction interface 19a on the side surface 15a of the step 15 to the surface of the protective film 16) is defined as d (μm), and the distance from the surface 16a (the surface opposite the n-layer 12 exposed on the bottom surface 15b of the step 15) of the protective film 16 on the bottom surface 15b of the step 15 to the pn junction interface 19 (the distance in a direction perpendicular to the pn junction interface 19) is defined as h (μm), the step 15 and the field plate structure are formed so as to satisfy $(\in_s \cdot h)/d \geq 4$ and $\in_s/d \geq 3$. Here, when the protective film 16 is formed of a plurality of layers, the thickness d is the total thickness of those layers, and $\in_s$ is an effective dielectric constant. When the field plate structure is formed so that $\in_s$, d, and h satisfy the above conditions, the vertical diode according to Embodiment 1 can achieve a high breakdown voltage performance as designed. Moreover, a predetermined breakdown voltage can be obtained by setting the correlation index $\in_s/d$ between the dielectric constant $\in_s$ and the thickness d as 3 or more. When the protective film 16 is too thick for the dielectric constant $\epsilon_s$ of the protective film 16, the effect of reducing the concentration of the electric field by the field plate structure is decreased, and a predetermined breakdown voltage sometimes cannot be obtained. More preferably, $(\epsilon_s \cdot h)/d$ is 4 or more, and $\epsilon_s/d$ is 4 (1/μm) or more. Further preferably, $(\epsilon_s \cdot h)/d$ is 5 or more and $\epsilon_s/d$ is 10 (1/μm) or more. The upper limit of $(\epsilon_s \cdot h)/d$ and $\epsilon_s/d$ may be set to any value within a range that the semiconductor device can perform its function.

The thickness of the protective film 16 depends on the material or the formation method of the protective film 16, and the shape of the step 15, which is sometimes not constant. In such a case, there is an ambiguity in defining the distance h and the thickness d, which affects the evaluation of the breakdown voltage. Therefore, in the present invention, the distance h and the thickness d are defined as follows. The thickness d is the shortest distance from the pn junction interface 19a exposed on the side surface 15a of the step 15 to the surface of the surface of the protective film 16. The thickness d is not necessarily the thickness of the protective film 16 in a direction perpendicular to the side surface 15a of the step 15. The distance h is defined in the following three cases:

(1) When the thickness $d_0$ of the protective film 16 at the bottom surface 15b of the step 15 (the thickness in a direction perpendicular to the bottom surface 15b) is constant in the vicinity of the side surface 15a of the step 15 (e.g. within a distance of $\epsilon_s/3$ or less from the side surface 15a)

In this case, the distance obtained by subtracting the thickness $d_0$ of the protective film 16 at the bottom surface 15b of the step 15 from the height $h_0$ between the bottom surface 15b and the pn junction interface 19 (the distance in a direction perpendicular to the bottom surface 15b) is defined as h (refer to FIG. 1).

Figure 6A:
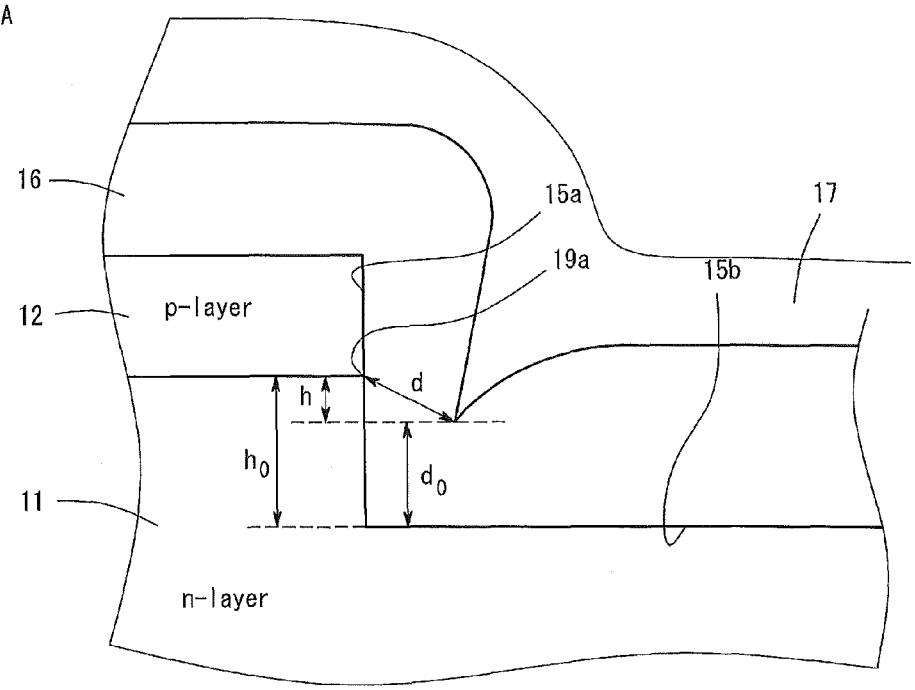
FIGS. 6A-6B illustrate the definition of distance h and thickness d.

(2) When the thickness of the protective film 16 at the bottom surface 15b of the step 15 in the vicinity of the side surface 15a of the step 15 of the protective film 16 is smaller as getting closer to the side surface 15a of the step 15 (refer to FIG. 6A).

In this case, the distance obtained by subtracting the smallest thickness $d_0$ of the protective film 16 at the bottom surface 15b of the step 15 in the vicinity of the side surface 15a of the step 15 of the protective film 16 from the height $h_0$ between the bottom surface 15b and the pn junction interface 19 is defined as h (refer to FIG. 6A).

Figure 6B:
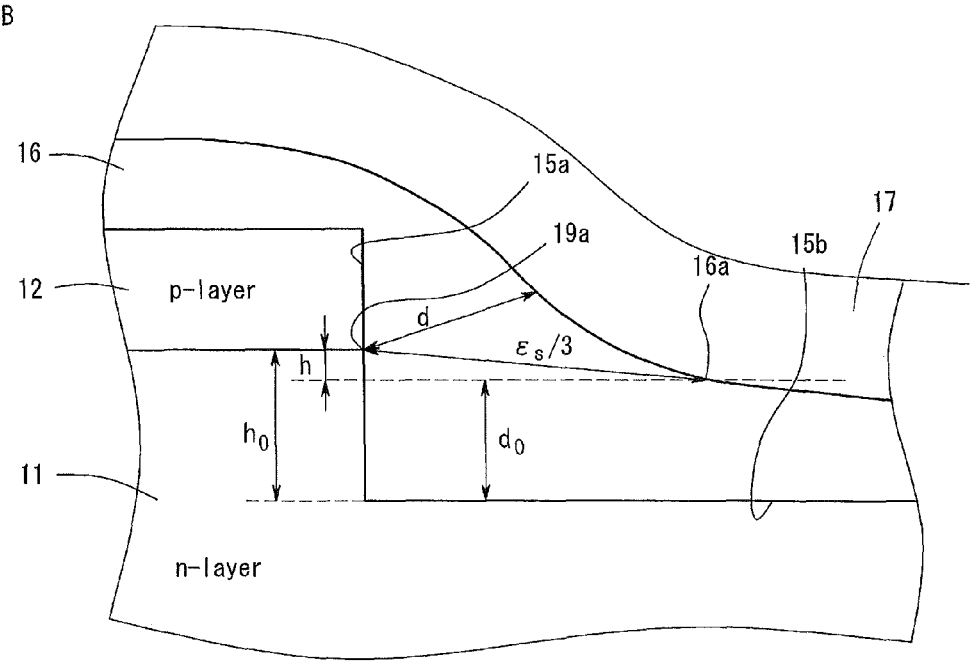

(3) When the thickness of the protective film 16 at the bottom surface 15b of the step 15 in the vicinity of the side surface 15a of the step 15 of the protective film 16 is larger as getting closer to the side surface 15a of the step 15 (refer to FIG. 6B).

In this case, the surface of the protective film 16 in which the distance from the pn junction interface 19a exposed on the side surface 15a of the step 15 is $\epsilon_s/3$ is defined as 16a, the thickness of the protective film 16 at the surface 16a is defined as $d_0$. The distance obtained by subtracting the thickness $d_0$ from the height $h_0$ between the bottom surface 15b and the pn junction interface 19 is defined as h (refer to FIG. 6B).

The distance h and the thickness d are set so as to satisfy h/d≥0.5. When the distance h is small and does not satisfy h/d≥0.5, a sufficiently large electric field relaxing region cannot be formed, thereby the breakdown voltage of the device is not improved. When the distance h is large enough and satisfies h/d>3, the effect of improving the breakdown voltage is saturated. Moreover, it takes time to form the step 15 or the difficulty of forming the step 15 is increased. Therefore, preferably, 0.5≤h/d≤3, and further preferably, 1≤h/d≤2.

[Experimental Data]

Next will be described the experimental data supporting that a high breakdown voltage performance is achieved by satisfying $(\epsilon_s \cdot h)/d$≥4, and $\epsilon_s/d$≥3.

With the design value of the breakdown voltage set as 1200V, a plurality of samples having the following different structures were manufactured and the breakdown voltage was measured in the vertical diode according to Embodiment 1. In each sample, the n-layer 11 has the same structure, a thickness of 10 μm, and a Si concentration of $1.6 \times 10^{16}/cm^3$. The protective film 16 comprises $SiO_2$ whose dielectric constant is 4. On the other hand, the structure of the p-layer 12 and the depth of the step 15 are different in each sample. In the samples 1 and 2, the p-layer 12 is a single layer formed of $p^+$-GaN having a thickness of 0.25 μm and a Mg concentration of $1 \times 10^{20}/cm^3$. In the sample 1, the protective film 16 has a thickness d of 400 nm, and in the sample 2, the protective film 16 has a thickness d of 600 nm. In the samples 3 to 6, the p-layer 12 has a two-layer structure in which a $p^-$ layer, and a $p^+$ layer are sequentially deposited on the n-layer, the $p^-$ layer has a thickness of 0.5 μm and a Mg concentration of $1 \times 10^{19}/cm^3$, and the $p^+$ layer has a thickness of 0.1 μm and a Mg concentration of $1 \times 10^{20} cm^3$. The thickness d of the protective film 16 is set as 400 nm in the sample 3, 600 nm in the sample 4, 800 nm in the sample 5, and 1200 nm in the sample 6. In the samples 2, 3, and 5, the breakdown voltage was measured by varying the distance h.

Figure 2:
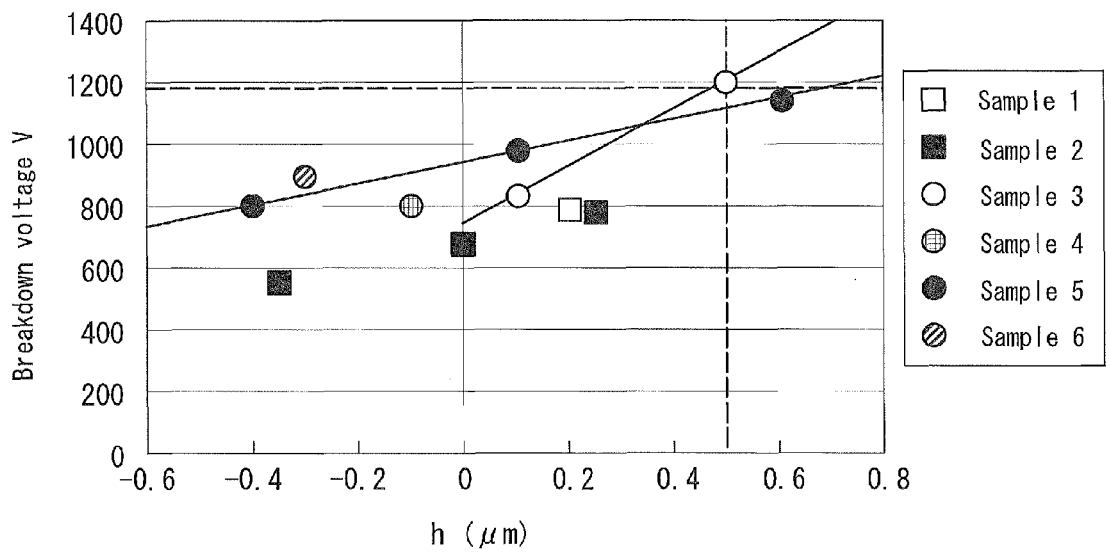
FIG. 2 is a graph showing the relationship between breakdown voltage and distance h.

FIG. 2 is a graph showing the dependency of the breakdown voltage on the distance h in the above samples. When the distance h is negative, the surface 16a of the protective film 16 is in a higher position than the pn junction interface 19 (when the surface 16a of the protective film 16 is positioned on the p-layer 12 side of the pn junction interface 19). It is observed that the breakdown voltage of the sample 3 increases in almost direct proportion to the distance h. In the sample 5 as well, the breakdown voltage increases in almost direct proportion to the distance h. However, the inclination of increase in the breakdown voltage is different between the samples 3 and 5. This inclination difference is thought to be due to the thickness d of the protective film 16. The protective film 16 is formed of the same material, $SiO_2$ in each sample. However, when the protective film 16 is formed of a material with a different dielectric constant, it is thought to influence the breakdown voltage as well.

Thus, it was found that the breakdown voltage performance of the vertical diode cannot be accurately evaluated by varying only the distance h.

Therefore, the inventors came up the idea of evaluating the breakdown voltage by introducing two indices of $(\epsilon_s \cdot h)/d$ and $\epsilon_s/d$ in consideration of the material (dielectric constant $\epsilon_s$) or the thickness d of the protective film 16 as well as the distance h.

Figure 3:
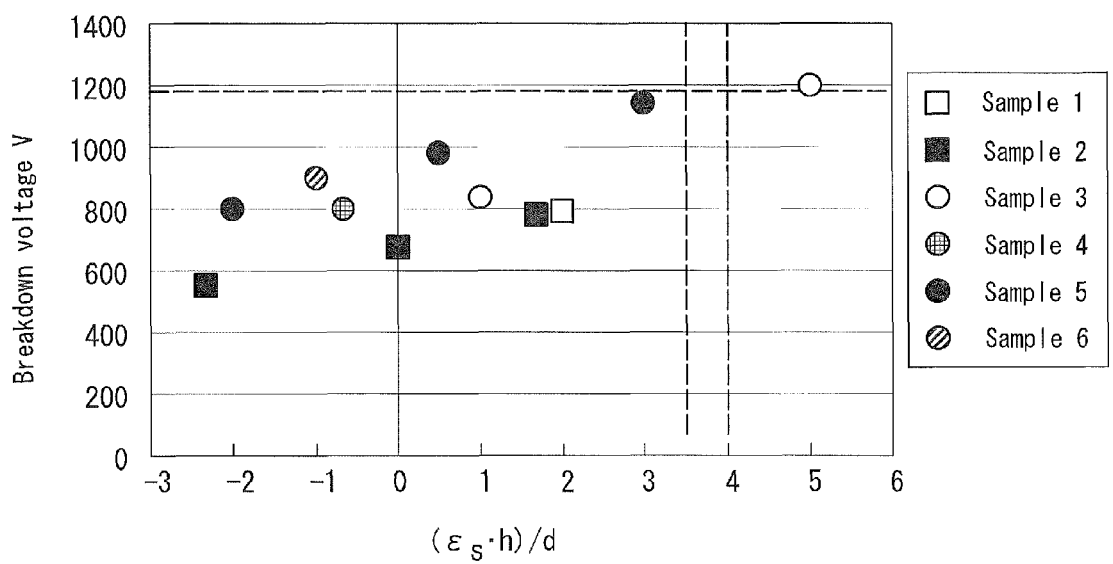
FIG. 3 is a graph showing the relationship between breakdown voltage and $(\in_s \cdot h)/d$.

FIG. 3 is a graph showing the dependency of the breakdown voltage on $(\epsilon_s \cdot h)/d$. As shown in FIG. 3, the breakdown voltage increases in direct proportion to the index of $(\epsilon_s \cdot h)/d$ in all samples, and the inclination hardly varies with the samples. Therefore, it is found that the breakdown voltage of the vertical diode can be more accurately evaluated by the index of $(\epsilon_s \cdot h)/d$. As is clear from FIG. 3, a breakdown voltage of 1200 V or more can be obtained when $(\epsilon_s \cdot h)/d$≥4, and a high breakdown voltage performance as designed can be achieved.

However, it is not sufficient to evaluate the breakdown voltage only by the index of $(\epsilon_s \cdot h)/d$. This is because when the protective film 16 is too thick for the dielectric constant $\epsilon_s$, the effect of reducing the concentration of the electric field due to the field plate structure is reduced even if $(\epsilon_s \cdot h)/d \geq 4$ is satisfied.

Figure 5:
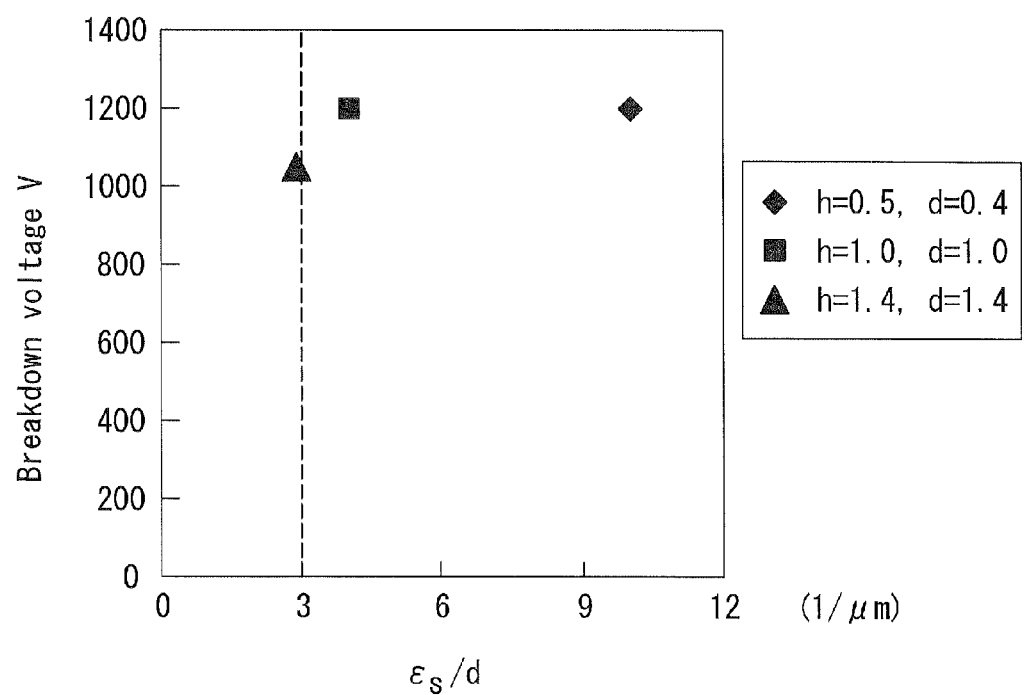
FIG. 5 is a graph showing the relationship between breakdown voltage and $\in_s/d$.

The dependency of the breakdown voltage on $\epsilon_s/d$ was measured. FIG. 5 is a graph showing the measurement result. The diamond plot shows the case of h=0.5 and d=0.4, the square plot shows the case of h=1.0 and d=1.0, and the triangle plot shows the case of h=1.4 and d=1.4. As shown in FIG. 5, when $\epsilon_s/d \geq 3$, the breakdown voltage is about 1200 V, and a high breakdown voltage performance as designed can be achieved. When $\epsilon_s/d$ is smaller than 3 (1/µm), the breakdown voltage is decreased below 1200 V. In both cases of the square plot and the triangle plot, $(\epsilon_s \cdot h)/d = 4$, and $(\epsilon_s \cdot h)/d \geq 4$ is satisfied. However, in the case of the square plot, the breakdown voltage is about 1200 V as designed, and the breakdown voltage as designed is achieved. On the contrary, in the case of the triangle plot, the breakdown voltage is about 1020V, and the breakdown voltage as designed cannot be obtained. It is found from this result that only condition of $(\epsilon_s \cdot h)/d$ is not sufficient as the index to evaluate the breakdown voltage, and the breakdown voltage must be evaluated, considering condition of $\epsilon_s/d$ in addition to condition of $(\epsilon_s \cdot h)/d$.

From the above experimental data, it was found that the breakdown voltage can be accurately evaluated by using two indices of $(\epsilon_s \cdot h)/d$ and $\epsilon_s/d$, and a high breakdown voltage performance as designed can be achieved when $(\epsilon_s \cdot h)/d \geq 4$ and $\epsilon_s/d \geq 3$ are satisfied. It was also found from the experimental data that the distance h can be reduced because the thickness d can be reduced by using a high dielectric contact material such as $HfO_2$ as the protective film. If the distance h can be reduced, the time and the difficulty of forming the step 15 can be respectively shortened and reduced.

Embodiment 2

Figure 7:
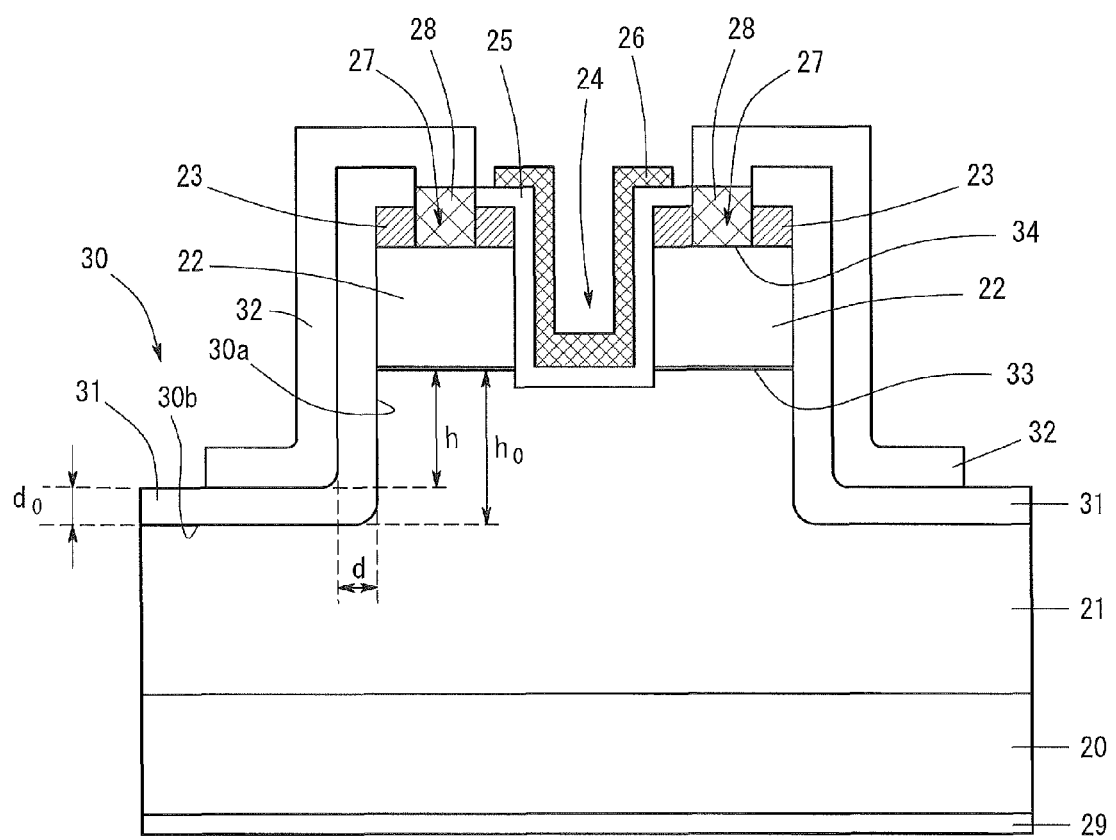
FIG. 7 shows the configuration of a vertical trench gate MOSFET according to Embodiment 2.

FIG. 7 shows the configuration of a vertical trench gate MOSFET according to Embodiment 2. The vertical trench gate according to Embodiment 2 comprises a substrate 20, an n-layer 21 of n-GaN formed on the substrate 20, a p-layer 22 of p-GaN formed on the n-layer 21, and a high concentration n-layer 23 of n-GaN formed on the p-layer 22. It also has a trench gate. That is, a trench 24 extending from the surface of the high concentration n-layer 23 (the surface opposite the surface of the p-layer 22) through the p-layer 22 to the n-layer 21 is formed. A gate insulating film 25 is formed so as to continuously cover the vicinity of an opening of the trench 24 on the surface of the n-layer 23, a side surface and a bottom surface of the trench 24. A gate electrode 26 is formed in contact with the gate insulating film 25 inside the trench 24.

On the surface of the high concentration n-layer 23, a trench 27 is formed so as to reach the p-layer 22, and a source electrode 28 is provided in contact with both the high concentration n-layer 23 and the p-layer 22. Thereby, the source electrode 28 can appropriately absorb holes from the p-layer 22, and the breakdown voltage is stabilized. On the back surface of the substrate 20 (the surface opposite the surface on which the n-layer 21 is formed), a drain electrode 29 is formed.

A step 30 is formed along an outer circumference of the device of the vertical trench gate MOSFET according to Embodiment 2. A mesa of the device is formed by the step 30. The step 30 may be a trench having two steps on the both sides of the trench. The step 30 has a depth extending from the high-concentration n-layer 23 to the n-layer 21. On the side surface of the step 30, a junction interface between the n-layer 21 and the p-layer 22 and a junction interface between the p-layer 22 and the high-concentration n-layer 23 are exposed.

The vertical trench gate MOSFET according to Embodiment 2 additionally has a field plate structure. The field plate structure comprises a protective film 31 and a field plate electrode 32. The protective film 31 is formed so as to continuously cover the bottom surface 30b and the side surface 30a of the step 30, and the vicinity of the side surface 30a of the step 30 which is the surface of the high-concentration n-layer 23. The field plate electrode 32 is formed so as to continuously cover the bottom surface 30b and the side surface 30a of the step 30, and the surface of the high-concentration n-layer 23 via the protective film 31 on, and in contact with the source electrode 28.

The structure of the vertical trench gate MOSFET according to Embodiment 2 will be described in detail below.

The high-concentration n-layer 23 has a high n-type impurity concentration so as to obtain a good ohmic contact with the source electrode 28. For example, the impurity concentration is $1.0 \times 10^{18}/cm^3$ to $1.0 \times 10^{20}/cm^3$. The p-type impurity concentration of the p-layer 22 is lower or equal to the n-type impurity concentration of the high concentration n-layer 23, e.g. the p-type impurity concentration is $1.0 \times 10^{17}/cm^3$ to $1.0 \times 10^{20}/cm^3$. The n-type impurity concentration of the n-layer 21 is lower than the p-type impurity concentration of the p-layer 22, e.g. the n-type impurity concentration is $1.0 \times 10^{15}/cm^3$ to $1.0 \times 10^{17}/cm^3$. Since the high-concentration n-layer 23, the p-layer 22, and the n-layer 21 are designed so as to have such impurity concentration, almost all of a depletion layer expands from a pn-junction interface 33 between the p-layer 22 and the n-layer 23 to the n-layer 21. Designing such impurity concentration reduces the influence on the breakdown voltage performance by the structures of the p-layer 23, the p-layer 22, and the n-layer 21, and facilitates the breakdown voltage design of the vertical trench gate MOSFET according to Embodiment 2.

The substrate 30, the source electrode 28, and the drain electrode 29 may have the same structure and its variation structure as the substrate 10 and the n electrode 13 of Embodiment 1. In Embodiment 2, the trench 27 is formed so that the source electrode 28 is in contact with both the high-concentration n-layer 23 and the p-layer 22. However, the source electrode 28 may be in contact only with the high-concentration n-layer 23, or an electrode for absorbing holes from the p-layer 22 may be separately formed in addition to the source electrode 28, in contact with the p-layer 22.

The gate insulating film 25 may be formed of any material as long as it is insulating, e.g. $SiO_2$. The gate electrode 26 may be formed of any material as long as it is conductive, e.g. Al, Ai, Au, TiN, and polysilicon.

The step 30 and the field plate structure have the same structure of the step 15 and the field plate structure of Embodiment 1. Its variation examples are applicable as well. Particularly, the step 30 and the field plate structure are formed so as to satisfy $(\epsilon_s \cdot h)/d \geq 4$ and $\epsilon_s/d \geq 3$. However, the pn junction interface 33 at which a depletion layer most expands from the p-layer 22 to the n-layer 21 of the pn junction interfaces 33 and 34 is defined as the datum for distance h and thickness d. The distance h and the thickness d are defined with the pn junction interface 33 as a datum, as in Embodiment 1.

The above described vertical trench gate MOSFET according to Embodiment 2 has a high breakdown voltage performance same as the pn diode according to Embodiment 1 because the step 30 and the field plate structure are formed so as to satisfy $(\epsilon_s \cdot h)/d \geq 4$ and $\epsilon_s/d \geq 3$.

Although the Embodiments 1 and 2 disclose a vertical semiconductor device of Group III nitride semiconductor, the present invention can be applied to a vertical semiconductor device formed of Group IV semiconductor such as SiC and Si, Group II-VI semiconductor, Group III-V semiconductor such as GaAs and GaP, and organic semiconductor other than Group III nitride semiconductor.

Although Embodiment 1 is a vertical diode, and Embodiment 2 is a vertical trench gate MOSFET, the present invention can be applied to a semiconductor device having a vertical pn junction and any structure in which the pn junction interface is exposed on the side surface of the step. The present invention also can be applied to, for example, a pn diode, PIN diode, FET, and bipolar transistor. Moreover, the present invention can be applied to not only the vertical type but the horizontal type semiconductor device.

Other conventional structure for improving the breakdown voltage can be further combined with the field plate structure of the present invention.

The present invention can be applied to any semiconductor device having a vertical pn junction, and can be employed in, for example, a high frequency device or a power device.

What is claimed is:

1. A vertical trench gate MOSFET device, comprising:
   a substrate comprising an n-type conductive n-GaN;
   an n-layer comprising an n-type conductive n-GaN formed on the substrate;
   a p-layer comprising a p-type conductive p-GaN formed on the n-layer;
   a gate trench extending to the n-layer;
   a gate insulating film formed so as to continuously cover a vicinity of an opening of the gate trench, a side surface and a bottom surface of the gate trench;
   a gate electrode formed in contact with the gate insulating film inside the gate trench;
   a source electrode for the p-layer;
   a drain electrode formed on a back surface of the substrate;
   a pn junction interface formed between the p-layer and the n-layer;
   a step formed at an outer circumference of the n-layer and the p-layer, and in which a side edge of a pn junction interface is positioned on a side surface of the step;
   a dielectric protective film formed so as to continuously cover the side surface of the step and a bottom surface of the step; and
   a field plate electrode comprising a conductive material formed so as to continuously cover the side surface of the step and the bottom surface of the step on the protective film,
   wherein, when a distance $(h_0-d_0)$ obtained by subtracting a thickness $d_0$ of the protective film on the bottom surface of the step from a height difference $h_0$ between the bottom surface of the step and the pn junction interface, the thickness $d_0$ being a thickness perpendicular to the bottom surface and a smallest thickness in an area on the bottom surface, is defined as h (μm), a dielectric constant of the protective film is defined as $\in_s$, and a shortest distance from the side edge of the pn junction interface to an interface between the protective film and the field plate electrode is defined as d (μm), the h (μm), and the d (μm) are values within an area commonly satisfied with four conditions that $(\in_s \cdot h)/d$ is 4 or more, $\in_s/d$ is 3 (1/μm) or more, h is 0.5 (μm) or more, and d is h/2(μm) or more, and a breakdown voltage of the vertical trench gate MOSFET is 1200 V or more wherein the MOSFET device further comprises a high n-type impurity concentration layer comprising an n-type conductive n-GaN connected to the p-layer and the source electrode; and wherein the MOSFET device further comprises a source trench extending from a surface of the high n-type impurity concentration layer to the p-layer, and the source electrode is contacted with the p-layer through the source trench.

2. The vertical trench gate MOSFET device according to claim 1, wherein the h (μm) and the d (μm) are values within an area also satisfied with a conditions that h/d is 0.5 or more.

3. The vertical trench gate MOSFET device according to claim 1, wherein a breakdown voltage increases in a direct proportion to an index of $(\in_s \cdot h)/d$ so as to be within a range of 1200 V or more.

4. The vertical trench gate MOSFET device according to claim 1, wherein the high n-type impurity concentration layer comprises the n-type impurity concentration of $1.0 \times 10^{18}/cm^3$ to $1.0 \times 10^{20}/cm^3$ and the p-layer comprises any p-type impurity concentration which is lower or equal to the n-type impurity concentration of the high n-type impurity concentration layer and is in a range of $1.0 \times 10^{17}/cm^3$ to $1.0 \times 10^{20}/cm^3$.

5. The vertical trench gate MOSFET device according to claim 3, wherein the high n-type impurity concentration layer comprises the n-type impurity concentration of $1.0 \times 10^{18}/cm^3$ to $1.0 \times 10^{20}/cm^3$ and the p-layer comprises any p-type impurity concentration which is lower or equal to the n-type impurity concentration of the high n-type impurity concentration layer and is in a range of $1.0 \times 10^{17}/cm^3$ to $1.0 \times 10^{20}/cm^3$.

6. The vertical trench gate MOSFET device according to claim 1, wherein a thickness of the protective film at the side edge of the pn junction interface on the side surface of the step is smaller than the thickness of the protective film at the bottom surface of the step.

7. The vertical trench gate MOSFET device according to claim 4, wherein a thickness of the protective film at the side edge of the pn junction interface on the side surface of the step is smaller than the thickness of the protective film at the bottom surface of the step.

* * * * *